United States Patent
Kamepalli et al.

(10) Patent No.: US 7,055,118 B1
(45) Date of Patent: May 30, 2006

(54) SCAN CHAIN VERIFICATION USING SYMBOLIC SIMULATION

(75) Inventors: Harinath B. Kamepalli, Mountain View, CA (US); Padmaraj Sanjeevarao, Sunnyvale, CA (US); Chang-Jin Park, Cupertino, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 35 days.

(21) Appl. No.: 10/790,650

(22) Filed: Mar. 1, 2004

(51) Int. Cl.
*G06F 17/50* (2006.01)
(52) U.S. Cl. .......................... 716/5; 716/18
(58) Field of Classification Search ................ 716/4–6, 716/18
See application file for complete search history.

(56) References Cited

U.S. PATENT DOCUMENTS

| | | | |
|---|---|---|---|
| 5,084,824 A * | 1/1992 | Lam et al. | 716/11 |
| 6,134,689 A | 10/2000 | Mateja et al. | 714/736 |
| 6,327,687 B1 | 12/2001 | Rajski et al. | 714/738 |
| 6,574,762 B1 | 6/2003 | Karimi et al. | 714/727 |
| 6,631,470 B1 | 10/2003 | Chang et al. | 713/3 |
| 6,634,012 B1 | 10/2003 | Zhong et al. | 716/5 |
| 2002/0053057 A1 | 5/2002 | Rajski et al. | 714/738 |
| 2002/0073380 A1* | 6/2002 | Cooke et al. | 716/1 |
| 2002/0176288 A1* | 11/2002 | Nozuyama | 365/200 |
| 2003/0023941 A1* | 1/2003 | Wang et al. | 716/4 |
| 2003/0065996 A1 | 4/2003 | Shimada et al. | 714/718 |
| 2003/0131298 A1 | 7/2003 | Rajski et al. | 714/738 |
| 2003/0204802 A1 | 10/2003 | Sim | 714/726 |
| 2004/0015800 A1* | 1/2004 | Zhong et al. | 716/5 |

OTHER PUBLICATIONS

Takahashi, Tsuyoshi, et al., "Design Flow and Design Environment for System LSIs," Hitachi Review vol. 48 (1999) No. 2, pp. 87-93.
Kurup, Pran, et al., "Mastering HDL for formula verification," Electronics Engineer, May 1999.
http://www.stridge.com/Stridge_articles/atpg_oview.html, "Memory ATPG Modeling and Validation Process".
http://www.synopsys.com/products/acmgr/innlo/, "Former InnoLogic Systems Products".
http://www.synopsys.com/products/acmgr/innlo/espcv.html, "ESP-CV".
http://www.synopsys.com/products/acmgr/innlo/esplv.html, "ESP-LV".
http://www.synopsys.com/products/acmgr/innlo/espbv.html, "ESP-BV".
http://www.synopsys.com/product/acmgr/innlo/ckt.html, "CKT".
http://www.synopsys.com/product/acmgr/innlo/casestudy/suncase.html, "Case Study".

* cited by examiner

*Primary Examiner*—Paul Dinh
(74) *Attorney, Agent, or Firm*—Hamilton & Terrile, LLP; Michael Rocco Cannatti (57) ABSTRACT

A method and apparatus for improved formal scan chain equivalence checking to verify the operation of components in a VLSI integrated circuit is described in connection with using symbolic simulation for verification of scan chain equivalency between different modeling representations of a circuit-under-test. The present invention enhances previous techniques by loading each scannable state-element in the circuit design with a symbolic expression that characterizes the logical location of the element and performing a scan shift operation to verify the contents of each scannable state-element at the scan-out and other primary output pins of the design.

12 Claims, 5 Drawing Sheets

SCAN CHAIN VERIFICATION USING SYMBOLIC SIMULATION

BACKGROUND OF THE INVENTION

1. Field of the Invention

The present invention relates generally to the field of integrated circuit design and fabrication. In one aspect, the present invention relates to a method and system for simulation and testing of integrated circuits and systems.

2. Description of the Related Art

Integrated circuits are presently tested using a number of structured design-for-testability (DFT) techniques. These techniques rest on the general concept of making all or some state variables (memory elements like flip-flops and latches) directly controllable and observable. If this can be arranged, a circuit can be treated, as far as testing of combinational faults is concerned, as a combinational network. The most-often used DFT methodology is based on scan chains. It assumes that during testing, all (or almost all) memory elements are connected into one or more shift registers. A circuit that has been designed for test has two modes of operation: a normal or functional mode, and a test or scan mode. In the normal mode, the memory elements perform their regular functions. In the scan mode, the memory elements become scan cells that are connected to form a number of shift registers called scan chains. These scan chains are used to shift a set of test patterns into the circuit and to shift out circuit responses, or test responses, to the test patterns. The test responses are then compared to fault-free responses to determine if the circuit works properly. Scan design methodology has gained widespread adoption by virtue of its simple automatic test pattern generation (ATPG) and silicon debugging capabilities. Conventional scan chain testing is performed using pattern-based simulations; however, as the complexity of circuits continues to increase, high fault coverage becomes increasingly difficult with traditional testing paradigms.

While scan chain testing is certainly useful for testing completed integrated circuit devices, the way in which integrated circuits are typically designed—using multiple abstraction levels (such as RTL and Schematic) of the design—creates a need to model test structures at different circuit model abstraction levels and to verify that the different models accurately correspond to one another (i.e., are equivalent). A number of approaches, such as pattern-based simulations, formal and semi-formal verification techniques (e.g., equivalence checking, symbolic simulation, model checking, etc.), are in practice to perform functional equivalency verification. Conventional approaches for verifying the equivalency of circuit models using formal and semi-formal methods typically provide only functional verification, not test verification. When test structures are verified, conventional techniques do so by serially shifting test data patterns of binary data (also referred to as test vectors or scan vectors) into the scan chains models through the scan inputs under the control of a scan clock which essentially represent pattern-based simulations.

As integrated circuits are produced with greater and greater levels of circuit density and complexity, the required testing and verification of the multiple levels of abstraction in circuit representation have become more complex, and traditional techniques for verifying such designs are generally expensive and can incur errors. Therefore, when models for a circuit test structures are maintained at multiple abstraction levels so that different analyses can be performed at the appropriate model level, it is important to be able to verify the equivalency of these representations (e.g. RTL and Schematic or any two) efficiently. Conventional equivalency verification of scan chains using pattern-based simulations is inherently not exhaustive and requires a lot of effort to generate correct patterns. There is also need for careful coverage analysis to ensure reasonable coverage of the design. Thus, efficient verification schemes providing high coverage with minimized effort are needed. Further limitations and disadvantages of conventional systems will become apparent to one of skill in the art after reviewing the remainder of the present application with reference to the drawings and detailed description which follow.

SUMMARY OF THE INVENTION

Broadly speaking, the present invention is a method and apparatus that provides a way to use symbolic simulation techniques to verify scan chain equivalency between different circuit models. With this approach, scan chain equivalency may be confirmed with respect to complete scan chain connectivity from scan-in pin (or primary input) to the scan-out pin (or primary output). In addition, scan chain equivalency of the logical location of all scannable state elements, including polarity, may be confirmed. Moreover, the present invention may be used to confirm scan chain equivalency of the scan chain length (the number of scannable state-elements) and the scan chain order (the sequence of scan chain connections).

In accordance with various embodiments of the present invention, a method and apparatus provides an improvement in equivalence checking to verify the operation of test structure components in a VLSI integrated circuit by using symbolic expressions to uniquely identify each and every scannable state-element in the design. Specifically, the present invention enhances previous techniques for verifying scan chain equivalency between different abstraction level models for a circuit by using symbolic simulation techniques to efficiently and completely generate correct patterns that provide reasonable coverage of the design. In a selected embodiment, a symbolic simulation tool is used to compare the equivalency of scan chain circuitry in a memory array portion of a circuit in its test mode, thereby verifying the correspondence of two different levels of the scan chain circuit description, such as RTL and schematic level descriptions.

The objects, advantages and other novel features of the present invention will be apparent to those skilled in the art from the following detailed description when read in conjunction with the appended claims and accompanying drawings.

DETAILED DESCRIPTION

A method and apparatus for improved scan chain equivalency verification is described. While various details are set forth in the following description, it will be appreciated that the present invention may be practiced without these specific details. For example, selected aspects are shown in block diagram form, rather than in detail, in order to avoid obscuring the present invention. Some portions of the detailed descriptions provided herein are presented in terms of algorithms and symbolic representations of operations on data bits within a computer memory. Such descriptions and representations are used by those skilled in the data processing arts to describe and convey the substance of their work to others skilled in the art. In general, an algorithm refers to a self-consistent sequence of steps leading to a desired result, where a "step" refers to a manipulation of physical quantities which may, though need not necessarily, take the form of electrical or magnetic signals capable of being stored, transferred, combined, compared, and otherwise manipulated. It is common usage to refer to these signals as bits, values, elements, symbols, characters, terms, numbers, or the like. These and similar terms may be associated with the appropriate physical quantities and are merely convenient labels applied to these quantities. Unless specifically stated otherwise as apparent from the following discussion, it is appreciated that throughout the description, discussions using terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

In accordance with a selected embodiment, the methods and systems for verifying scan chain equivalency between different models for a given circuit under test as shown and described herein may be implemented in software stored on a computer-readable medium and executed as a computer program on a general purpose or special purpose computer. The invention, for example, can be implemented in computer aided-design tools. For clarity, only those aspects of the software germane to the invention are described, and product details well known in the art are omitted. For the same reason, the computer hardware is not described in further detail. It should thus be understood that the invention is not limited to any specific computer language, program, or computer.

Figure 1:
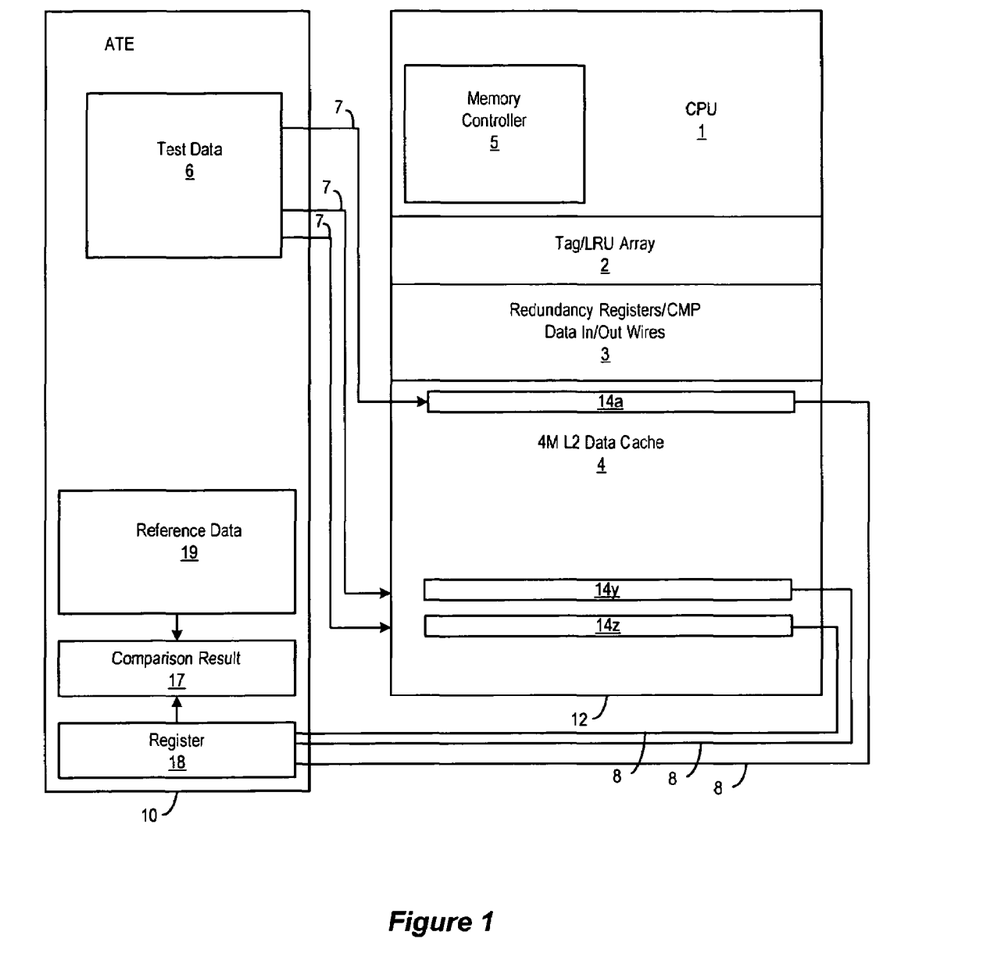
FIG. 1 is a block diagram representation of a system for testing digital circuits with scan chains.

FIG. 1 is a block diagram representation of a system for testing digital circuits specified test data 6 one by one to a circuit under test 12 in scan mode via input lines 7. For example, the circuit 12 may be Sun Microsystem's UltraSPARC microprocessor 12 having a CPU 1 and a large (4 Mbyte), on-chip integrated second-level cache 4 with approximately 315 million transistors. This embedded L2 cache memory block 4 gives the processor the bandwidth and performance required to meet the demands of today's Internet applications, but poses significant challenges for designers, particularly with reference to verifying functional and test behavior. To provide DFT structures, the circuit 12 includes scan chains 14a–14z (shown, for example, as being located in the on-chip L2 cache 4). After the test data is applied to the scan chains 14, the circuit 12 is then run in normal mode using the test data as input, and the test response to the test pattern is stored in the scan chains 14. With the circuit again in scan mode, the response is then routed to the tester 10 for storage in the register 18. The stored test data is compared with a fault-free reference response 19, also one by one. While this scan chain testing technique can be used in a tester environment after the silicon is received from a fab, the way in which integrated circuits are designed (namely, with circuit models having differing levels of abstraction) has created a need for efficient simulation and verification of test circuit structures at the differing levels of modeling created in the course of designing the circuit 12.

Figure 2:
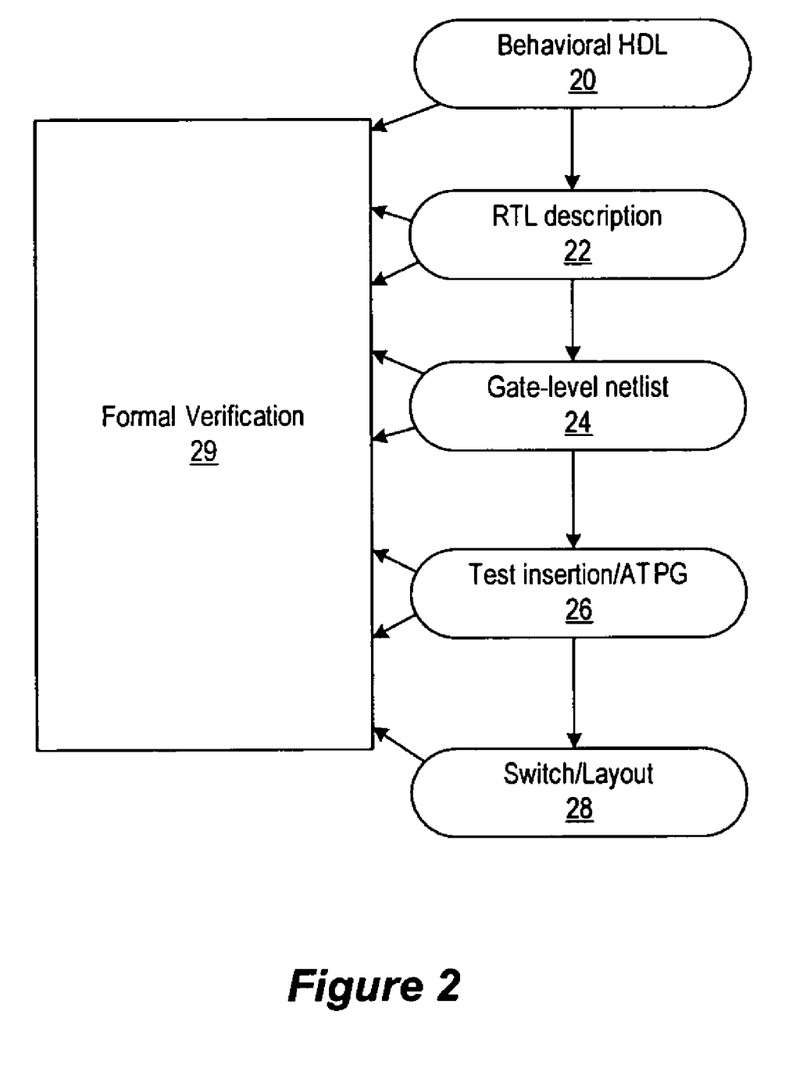
FIG. 2 illustrates how the formal verification techniques of the present invention can be used at any stage of a circuit design.

For example, and as illustrated in FIG. 2, integrated circuits are typically designed using several successive layers of refinement in abstraction to pass a circuit from algorithm to implementation, with the most abstract being at the top and the concrete physical implementation at the bottom. At the top level, the behavioral description 20 of a circuit is description of the operations that are to take place and the communication of information among them, without specifying the allocation of resources to accomplish those operations or communications, and without specifying the exact timing of those operations or communications, either in their starting times, their durations, or their total ordering. The register-transfer level (RTL) description 22 is used to describe a circuit at a high level of Boolean functionality and data flow, and contains information about all the operations and communications present in the system, including specific information about which resources are instantiated to perform those operations and communications, and may include statements of what registers, or data storage elements, are present and how and when they are to be used to store the results of operations, and to transfer those results to subsequent operations that use those results.

It is typical for the RTL description 22 to be translated into an equivalent gate level and switch level design to fabricate the actual integrated circuit. The gate-level netlist 24 provides a schematic description of circuit components as interconnections of basic blocks having known Boolean functionalities, and is a more detailed description of the circuit in terms of the logic gates and their interconnections needed to form the circuit. There are a variety of logic synthesis programs available for generating the gate-level netlist 24, including products provided by Synopsys. The switch/layout level of description 28 provides a representation of switches (transistors) and gates that implement the desired functionality for a particular circuit, and contains information about the actual physical implementation of the circuit in semiconductor form, including the actual masking from one transistor to another.

During circuit design, testing circuit structures may be included in the design so that the circuit functionality and performance can be evaluated. In accordance with the present invention, the inclusion of test circuit and ATPG structures 26 can be added at any stage of the circuit design, and is not necessarily limited to being included after the gate-level netlist is generated as depicted in FIG. 2.

With multiple levels of circuit abstraction, it is important to be able to verify the correct correspondence between the different levels of test structure circuit descriptions. This is especially useful when higher level circuit descriptions, such as RTL descriptions, are manually converted to lower level descriptions, such as a transistor or schematic level description. As illustrated in FIG. 2, formal verification techniques 29 (such as equivalence checking, model checking and theorem provers) can be used at any stage of the circuit design process to confirm and verify that different level circuit descriptions correspond to one another. Formal verification techniques can be used to prove the accuracy of the design and generally require less effort and computer resources than traditional verification techniques. Formal equivalence checking is one of the most widely used formal verification techniques for VLSI design. Most current tools employ formal methods at the RTL and gate level. However, with conventional functional verification tools (such as Synopsys' ESP family of verification tools), equivalence checking is used to confirm the expected input and output values for the circuit in its functional or normal mode of operation.

In connection with a selected embodiment of the present invention, formal verification 29 is used to confirm the equivalency of scan chain test structures included in different levels of the circuit description. Thus, it will be appreciated that FIG. 2 is intended to be a general representation of a design flow, not an all-inclusive one, and it is not necessary to traverse it sequentially in top-to-bottom fashion. This results from the fact that there are typically many iterations between levels of abstraction, including branching of design alternatives, as well as partial refinement of designs at mixed levels of abstraction. There are also methodologies in which skipping levels of abstraction in the design flow is appropriate. The lowest levels are the most well-defined and standardized according to the current technologies available. The upper levels are less well-defined and have more available alternatives for how designs are specified at those levels of abstraction. As a result, the test circuits may be inserted at any stage or any level of the IC design flow, including in the functional specification or algorithm stage, the behavioral HDL stage, the RTL coding stage, the behavioral simulation stage, the logic synthesis stage, the gate-level netlist generation stage, the gate-level simulation stage or the switch and layout stage. One of the main benefits of modeling test structures at high levels of abstraction is it facilitates ease of debug.

As the size and complexity of the circuits increases, it becomes more difficult to completely verify circuit behavior at the different circuit description levels. For example, when designers need to prove that functionality is identical between the high-level model used in full-chip simulation and the transistor-level model used to fabricate the block, sequential equivalence checking is used, which can be a difficult and time-consuming process when run on blocks of millions of transistors. Equivalence checking uses a mathematical approach to verify equivalence of a reference and a revised design, and ensures that the designs behave identically under all possible conditions. For example, equivalence checkers are used to verify equivalence of different RTL or gate level implementations. The equivalence checker compares corresponding combinational blocks by first breaking the design into smaller comparison points or key points, and then evaluates whether the logic function at a given key point in one design is equivalent to a matching key point in the other design. The comparison points are input ports, state points (or registers), scannable state-elements and/or output ports. A logic cone is a group of signals that drive a comparison point. The logic cone has n-inputs (primary inputs, state points) and one output. In general, formal verification tools accept design descriptions in VHDL (RTL/gate level), Verilog (RTL/gate level), and in other gate-level netlist formats, such as EDIF and NDL.

As will be appreciated, conventional formal verification tools are typically used for functional verification, and have not been used for test structure verification. In addition, conventional scan chain equivalence verification uses pattern-based simulations which are not entirely satisfactory because they use switch level simulators that rely on test vectors that do not guarantee adequate coverage. The deficiencies of conventional verification approaches are particularly acute with the larger and more complex circuits, such as the L2 cache memory 4 depicted in FIG. 1. To address such deficiencies, the present invention uses symbolic simulation techniques for scan chain verification to check the equivalency of scan chains in multiple representations of the design. While symbolic simulation has been used in connection with functional design verification applications (such as described in U.S. Pat. No. 6,634,012 to Zhong et al., which is hereby incorporated by reference in its entirety), the present invention contemplates a new and hitherto undisclosed application of symbolic simulation to perform scan chain equivalency verification. In a selected embodiment, equivalency checking of scan chain test structures in memory designs is performed using symbolic simulation of the differing test structure circuit models, though the present invention may also be applied in other integrated circuit areas, including but not limited to input/output circuitry, custom logic circuits and custom data path circuits.

Symbolic simulation is an event-driven simulation technique that uses symbols (or variables) as inputs to a circuit model instead of binary data inputs. As a result, Boolean expressions or equations may be propagated through the circuit model logic instead of discrete events, and multiple vectors may be represented with the new symbols that are created by clocking the circuit model. Thus, in contrast to traditional binary simulation which explores the design space one point at a time, symbolic simulation covers multiple (e.g., thousands or millions) of points per cycle.

In one embodiment, a symbolic simulator is instructed to treat selected specified input signals as symbols through one or more programming commands or statements that declare certain variables as symbols. For example, a command may be used to indicate to the simulator that an object in a hardware description language used to indicate a signal (e.g., a Verilog object) is to be a symbol to the simulator, such that variable assigned objects are designated as symbolic variable objects for purposes of modeling the scan chain circuitry under test. Upon encountering such a programming statement, the symbolic simulator propagates logic expressions, instead of binary values, capturing the relationship from input to output for the scan chain circuit.

Figure 3:
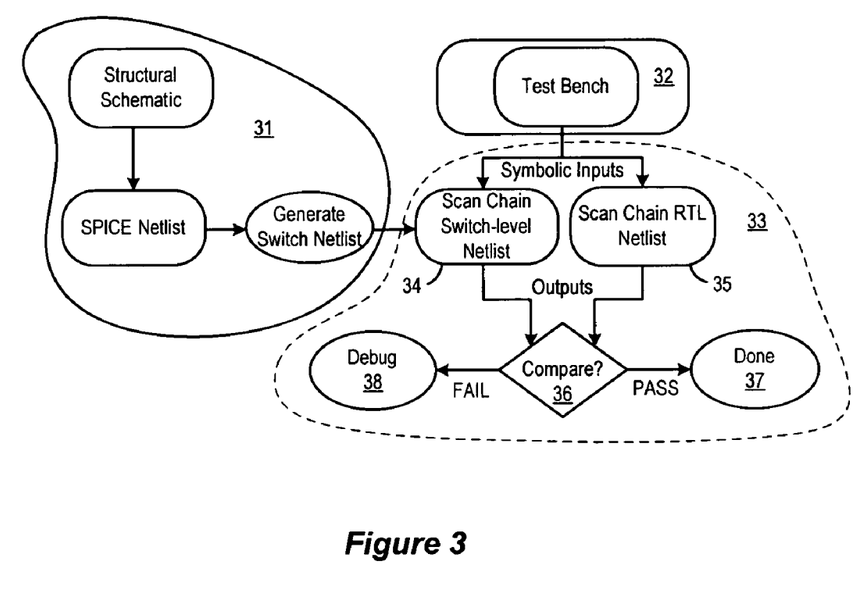
FIG. 3 illustrates an exemplary verification flow system and methodology in accordance with the present invention.

FIG. 3 illustrates an electronic system and method for using symbolic simulation for verification of scan chain equivalency between two representations of a circuit design that are maintained at different levels. On a first platform or computer 31, a switch-level netlist for the scan chain circuit is generated using structural schematic information to create a SPICE netlist file that is used to generate a switch-level netlist with the scan chain structures 34. In this example, the switch-level netlist provides a scan chain circuit netlist 34 for comparison to another simulation model (e.g., scan chain RTL netlist 35).

In a second platform or computer 32, symbolic inputs are generated by a testbench 32 for the scan chain circuit models being compared. As will be appreciated, testbench management tools provide a higher level abstract of the test vectors to provide a language for creating tests and measurement tools to help the quantify test coverage. Testbench 32 generates symbolic inputs for the two scan chain models being verified. In a selected embodiment, the symbolic testbench 32 unit is a Verilog file consisting of variable declaration segment(s), RTL and transistor top module instantiation segment(s), symbolic variable definition and declaration segment(s), task segment(s) for output checking, main symbolic body segment(s) and task segment definitions for applying inputs.

The symbolic inputs from the testbench 32 are provided as inputs to the first scan chain circuit model (e.g., switch-level netlist 34) and the second scan chain circuit model (e.g., RTL netlist 35), which may be maintained in a third platform or computer 33. The scan chain circuit models are then simulated, and their scan outputs are captured, compared and verified with an equivalency checking tool 36. In a selected embodiment, a verification solution, such as Synopsys' ESP-CV solution, may be used to read the SPICE netlist, to convert it to a Verilog switch level model and to implement the comparison tool 36, though other symbolic simulation verification solutions may also be used to implement the comparison function. In accordance with the present invention, all the primary outputs, including scan-out pin, may be checked for equivalency throughout the simulation. As illustrated in FIG. 3, this equivalency checking may be implemented in computing device 33 at comparison block 36. If the scan chain equivalency is verified, the circuit models pass the comparison test, as indicated at block 37.

In accordance with a selected embodiment of the present invention, if the scan chain equivalency comparison fails, a waveform may be generated for purposes of debugging, as indicated at block 38. Thus, the present invention permits a check to be inserted to perform a complete test and generate information allowing the re-creation of any identified fault. In one embodiment, the simulator is instructed to perform the check through the use of one or more programming statements that generate a file of one or more vectors that may be used to locate any identified fault, thereby simplifying debug operations 38. In one embodiment, the comparison tool generates binary vectors when errors are found that may be used for debugging. Once an error has been identified, well-known simulators that employ binary vectors may be used to isolate the fault.

In accordance with the foregoing exemplary description of the present invention, the various platforms or computers may be implemented as separate computing devices, may be integrated in whole or in part on fewer computing devices, or may be implemented across a plurality of computing devices.

In accordance with the present invention, symbolic simulation allows designers to simulate multiple binary vectors (or vector streams) together as one simulation. This is achieved by allowing the simulator to accept "symbols" as inputs, just like binary 0 or 1 values. These symbols represent both values 0 and 1 simultaneously on the input to which they are applied. Like binary simulation, symbolic simulation requires a testbench to apply input stimulus and check output results. The only difference is that symbols need to be applied as inputs wherever desired in a symbolic simulation testbench. An advantage of symbolic simulation is that $2*n$ (n=number of symbols) equivalent binary vectors are investigated simultaneously. Thus, by using symbolic simulation techniques to verify scan chain equivalency between two representations (e.g., RTL and Schematic or any two), the present invention provides an exhaustive analysis with minimal design-specific effort.

In a selected embodiment, scan chain equivalency between RTL and Schematic models of arrays can be checked using the symbolic simulation technique of the Synopsys ESP-CV tool. With this approach, the present invention may confirm scan chain equivalency with respect to the complete scan chain connectivity from scan-in pin (primary input) to scan-out pin (primary output). In addition, the equivalency of the logical location of all scannable state-elements, including polarity, may also be confirmed. As will be appreciated, the logical location refers to a characteristic function for each instance of any device in the design that expresses the behavior of the output(s) of that instance in terms of primary inputs of the entire design considering both combinatorial and temporal aspects. The present invention may also be used to confirm the scan chain equivalency of the scan chain length (number of scannable state-elements) and the scan chain order (the sequence of scan chain connections).

By using symbolic simulation techniques for formal verification of scan chains in custom circuits (including but not limited to custom memory circuits, such as RAM, SRAM, arrays, CAM structures, flash, cache, register files and custom datapath designs), designers can obtain complete coverage with shorter runtimes than was possible with previous techniques.

In accordance with a selected embodiment of the present invention, each and every scannable state-element in the design of a circuit under test (e.g., L2 cache 4) may be uniquely identified so as to verify the equivalency of the scan chain with respect to four characteristics: scan chain connectivity, logical location, scan chain length and scan chain order. If each scannable state-element in the design holds a unique symbolic expression that represents its logical location in the design, the performance of a scan-shift and checking the sequence of expressions received at scan-out pin will be sufficient to verify the scan chain equivalency. The unique symbolic expression for each scannable state-element based on its logical location in the design can be achieved by performing the functional mode symbolic simulation for a latency threshold number of cycles (SS_LATENCY) which is defined as the maximum of all sequential depths of all scannable state-elements on all paths from all primary inputs. Thus, functional mode simulation for the latency threshold number of cycles, followed by scan shift for (SC_LENGTH+1) times is sufficient to verify the equivalency of the above stated four characteristics of the scan chain, where SC_LENGTH represents the scan chain length. The one additional cycle in the (SC LENGTH+1) scan shift cycles is required to ensure connectivity between the scan-in pin (primary input) and the first state-element in the scan chain, which can be checked by observing that the symbols applied to scan-in pin (primary input) arrive at the scan-out pin (primary output) after (SC_LENGTH+1) scan shifts.

Referring again to FIG. 3, a series of processing steps is disclosed for symbolically simulating and comparing a scan chain design. The process may be performed by processing logic which may comprise software, hardware or a combination of both. As a preliminary step 31, a first scan chain circuit description (such as a switch-level netlist description of the scan chain circuit) is generated. In addition, a second scan chain circuit description (such as an RTL netlist description of the scan chain circuit) is generated. Next (or in addition), a testbench generates input symbols 32 for input to both the first and second scan chain circuit descriptions. In a selected embodiment, the simulator accepts a Verilog netlist of a scan chain circuit and the user instructs the simulator to run with one, more or all inputs symbolically. In such a case, the user may specify which inputs using a programming language interface (PLI) command which is inserted into the design flow. Other languages may have other similar mechanisms to the PLIs, such as for example using an API in HDL, and may be used in the same manner.

Next, the circuit descriptions are symbolically simulated (processing block 33), which allows symbols to be added to existing binary values during simulation. When the simulator detects a symbol input, it propagates a boolean expression instead of propagating the digital value that is the result of the logical operation on the inputs. As the expressions are propagated, they capture the input/output mapping for all possible conditions for the scan chain circuit(s). Although the final output expression may be very lengthy, they can readily be used to check against specified assertions or to compare against a reference model, particularly where the reference model is in symbolic format as well. By using symbols, one is able to fully verify a scan chain circuit without having to select a set of values.

Figure 4:
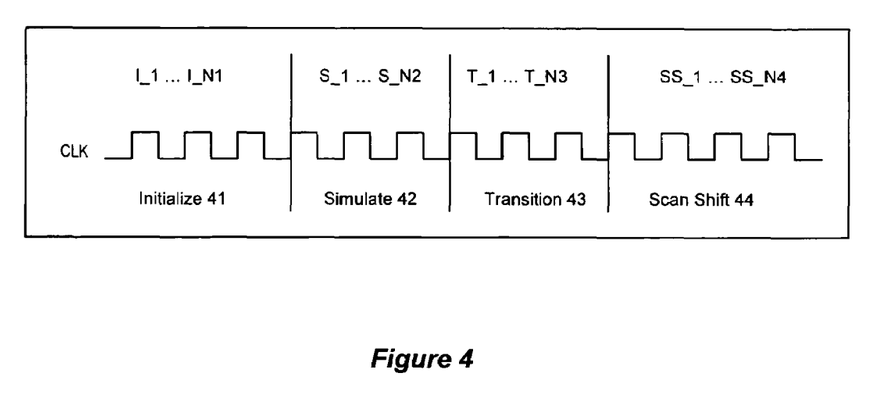
FIG. 4 shows a cycle sequence in scan chain verification using symbolic simulation.

FIG. 4 depicts an exemplary sequence of operations performed during scan chain verification using symbolic simulation. As will be appreciated, the cycle labels set forth in FIG. 4 represent corresponding operations with respect to the signals applied at primary inputs, and are not necessarily the cycles during which corresponding operations actually happen internally. The symbolic simulation process begins with N1 initialization cycles 41, labeled as I_1 to I_N1, during which the symbolic simulator starts the clock signal and lets it propagate through any clock control logic. Throughout this initialization period, default values (inactive values) are applied to all primary inputs of the design. The number N1 is design-dependent and is usually equal to at least 1.

After these initialization cycles, the design should be simulated in the functional mode for N2 cycles 42 (labeled as S_1 to S_N2), during which appropriate symbols are applied to all primary inputs. In a selected embodiment, during the first few functional mode cycles (S_1 to S_N2), symbols are applied using all the constraints used for functional mode verification, if there are any. The constraints are typically used to represent any specific correlation among various inputs to the designs so that the possible input combinations are limited to legal combinations. The number N2 is the SS_LATENCY value described herein. The SS_LATENCY value is typically greater than or equal to 1. The larger this number is, the more complex the symbolic simulation. As a result, symbolic simulation is generally more suitable for designs with shorter pipeline depths. At the end of the cycles for the functional mode simulation, all of the scannable state-elements are loaded with symbolic expressions that are representative of their logical position in the design.

For a sequence of N3 transition cycles 43 (labeled as T_1 to T_N3), the symbolic simulation is run, during which time the functional mode clocks are turned off and all other non-clock-control related primary input signals are held to their last symbolic values. The non-clock-control primary inputs are held to their last symbolic values such that the content(s) of any scannable state-element are not overwritten to binary values if turn-off of its functional mode clock is delayed due to any latency on clock control paths. The number N3 is the number of cycles of separation required between functional mode clocks and scan-shift mode clocks for the designs to work correctly. The value for N3 is design-specific, and is typically greater than or equal to 1.

Scan shift cycles 44 (labeled as SS_1 to SS_N4) follow the transition cycles 43 and involve a regular repetition of scan clocks. N4 is equal to the product of N and (SCAN_CHAIN_LENGTH+1), where N is the number of cycles required to perform a single scan shift and SCAN_CHAIN_LENGTH is the number of scannable state-elements in the design. Throughout the scan shift process, all the non-clock-control related primary inputs, except the scan-in pin, are held to their inactive values. Symbolic values are applied to the scan-in pin such that the connectivity between the primary input scan-in pin and the first scannable element can be checked. Functional mode simulations 42 can not be performed once the scan shift 44 starts because the contents (symbolic expressions) of various scannable state-elements can contain illegal combinations. This is one of the reasons for not loading scannable state-elements with unique symbols through a scan shift operation.

While the present invention is described with reference to a single scan chain embodiment, it will be appreciated that the methodology and procedure of the present invention may also be applied to designs with multiple scan chains. In such a case, the SCAN_CHAIN_LENGTH parameter is the length of the longest scan chain.

Figure 5:
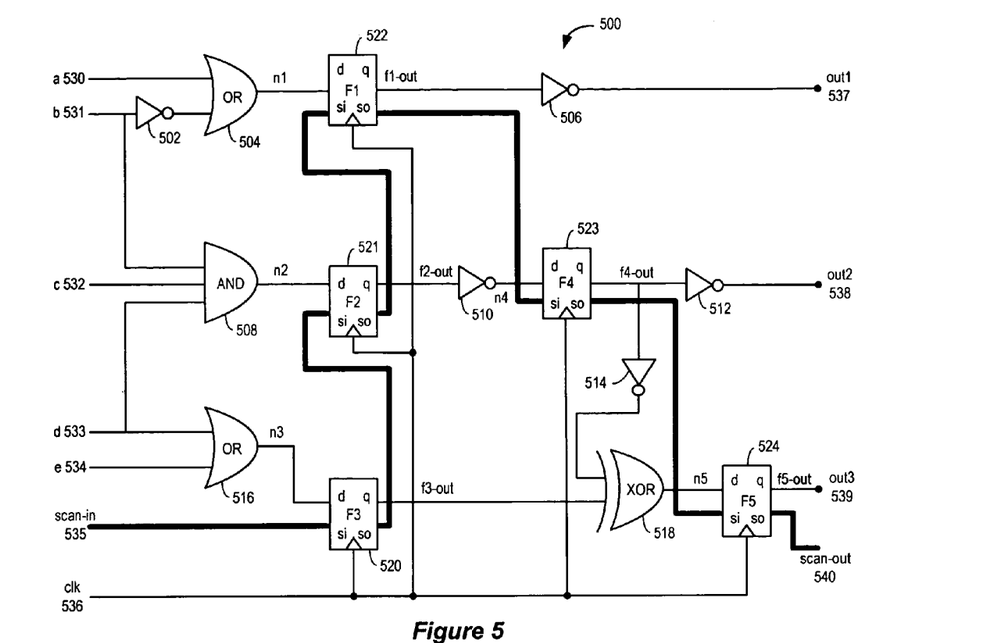
FIG. 5 shows a schematic representation of an example scan chain test case.

FIG. 5 shows a schematic representation of an example scan chain test case. The circuit under test comprises a combination of logic gates (502–518) coupled to receive a plurality of inputs (a–e) and to generate a plurality of outputs (out1–out3). As will be appreciated, the circuit under test depicted in FIG. 5 is only an example design, and other scan chain circuit designs can also be verified in accordance with the present invention. Scannable state-elements (F1–F5) are placed at all interior nodes (n1–n5) of the circuit under test and are connected to pass either circuit signals generated by the logic gates or scan signals input through the scan-in pin 535 under control of a common clock signal 536 (clk). Although the scannable state-elements are depicted as being constructed with flip-flops, it will be appreciated that any of a variety of data storage devices or circuits may be used in place or in combination with flip-flops, including but not limited to memory elements, latch circuits, registers or the like.

As depicted in FIG. 5, the primary inputs for the example design are labeled a, b, c, d and e. The primary outputs for the example design are labeled out1, out2 and out3. With this example design, the design parameter SCAN_CHAIN_LENGTH=5. And as seen from the longest path to the deepest scannable element (flip-flop F5), the design parameter SS_LATENCY=3, which reflects the path F2–F4–F5. For purposes of simplicity, the scan-in and scan-out clocks and associated control logic for the scan chain elements F1–F5 are not shown in the circuit diagram of FIG. 5. The relatively thick line between the scan-in pin 535 and the scan-out pin 540 connecting the scan elements represents the scan chain connections in the order of scan elements, F3, F2, F1, F4 and F5. In a selected embodiment, each of the scan elements F1–F5 may be implemented as a scannable flip-flop having a data input (d) and data output (q) (for passing circuit signals), a scan-in input (si) and a scan-out output (so) (for passing scan signals), and a clock input (for clocking the flip-flop).

Figure 6:
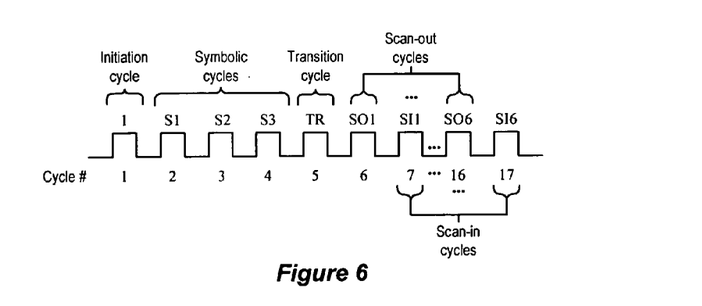
FIG. 6 shows the cycle sequence used to verify the scan chain equivalency between two representations of the example circuit shown in FIG. 5.

FIG. 6 shows the cycle sequence used to verify the scan chain equivalency between two representations of the example circuit shown in FIG. 5. As illustrated in FIG. 6 and exemplified in Tables A–C (described below), the cycles proceed sequentially from cycle number 1 through cycle 17. In the initiation cycle (labeled "I"), the inputs are initialized by keeping the normal clock signal (e.g., clk) active and applying default or "0" values to all other primary inputs. During the symbolic cycles (labeled S1, S2 and S3), the normal clock signals are active and symbols (e.g., a_sym1, b_sym1, etc.) are applied to all other primary inputs (a, b, c, d and e). As a result and as shown in Tables A–C, the symbols propagate through the logic under control of the leading edge (or trailing edge) of the clock signal which latches the values to the outputs of the flip-flops. During the transition cycle(s) (labeled TR), all clock signals are turned off and the last set of symbols applied to the primary inputs (a, b, c, d and e) are held constant. During the scan out cycles (labeled SO1, SO2, S03, SO4, SO5, SO6), the scan out clock signals are active and default values are applied to all other inputs. Interleaved within the scan out cycles are the scan in cycles (labeled SI1, SI2, SI3, SI4, SI5, SI6) where the scan in clocks are active and default values are applied to all other primary inputs. As depicted in the tables below, the result is that the scan-out pin 540 sequentially receives the signal values captured at the flip-flops, starting with the first scan out value captured at the last flip-flop F5 at cycle 6, and proceeding until the last scan out value from the first flip-flop F3 in the scan chain is passed along the scan chain at cycle 16.

In accordance with the present invention, a symbolic simulator may be used to simulate the scan chain design depicted in FIG. 5. Set forth below in Table A are the values on the various nets for a symbolic simulation of the scan chain design depicted in FIG. 5 when the clock signals, input symbols, function simulation, transition and scan shift cycles are applied as described herein.

TABLE A

| | Net a | Net b | Net c | Net d | Net e | Net scan-in | Net clk | Net siclk | Net soclk | Net f1__out | Net f2__out |
|---|---|---|---|---|---|---|---|---|---|---|---|
| Cycle 1 | 0 | 0 | 0 | 0 | 0 | 0 | Active | 0 | 0 | X | X |
| Cycle 2 | a_sym1 | b_sym1 | c_sym1 | d_sym1 | e_sym1 | si_sym1 | Active | 0 | 0 | 1 | 0 |
| Cycle 3 | a_sym2 | b_sym2 | c_sym2 | d_sym2 | e_sym2 | si_sym2 | Active | 0 | 0 | (a_sym1) + (~b_sym1) | (b_sym1)(c_sym1)(d_sym1) |
| Cycle 4 | a_sym3 | b_sym3 | c_sym3 | d_sym3 | e_sym3 | si_sym3 | Active | 0 | 0 | (a_sym2) + (~b_sym2) | (b_sym2)(c_sym2)(d_sym2) |
| Cycle 5 | a_sym3 | b-sym3 | c_sym3 | d_sym3 | e_sym3 | si_sym3 | Active | 0 | 0 | (a_sym3) + (~b_sym3) | (b_sym3)(c_sym3)(d_sym3) |
| Cycle 6 | 0 | 0 | 0 | 0 | 0 | si_sym3 | 0 | 0 | Active | (a_sym3) + (~b_sym3) | (b_sym3)(c_sym3)(d_sym3) |
| Cycle 7 | 0 | 0 | 0 | 0 | 0 | si_sym3 | 0 | Active | 0 | (b_sym3)(c_sym3)(d_sym3) | (d_sym3) + (e_sym3) |
| Cycle 8 | 0 | 0 | 0 | 0 | 0 | 0 | 0 | 0 | Active | (b_sym3)(c_sym3)(d_sym3) | (d_sym3) + (e_sym3) |
| Cycle 9 | 0 | 0 | 0 | 0 | 0 | 0 | 0 | Active | 0 | (d_sym3) + (e_sym3) | si_sym3 |
| Cycle 10 | 0 | 0 | 0 | 0 | 0 | 0 | 0 | 0 | Active | (d_sym3) + (e_sym3) | si_sym3 |
| Cycle 11 | 0 | 0 | 0 | 0 | 0 | 0 | 0 | Active | 0 | si_sym3 | 0 |
| Cycle 12 | 0 | 0 | 0 | 0 | 0 | 0 | 0 | 0 | Active | si_sym3 | 0 |
| Cycle 13 | 0 | 0 | 0 | 0 | 0 | 0 | 0 | Active | 0 | 0 | 0 |
| Cycle 14 | 0 | 0 | 0 | 0 | 0 | 0 | 0 | 0 | Active | 0 | 0 |
| Cycle 15 | 0 | 0 | 0 | 0 | 0 | 0 | 0 | Active | 0 | 0 | 0 |
| Cycle 16 | 0 | 0 | 0 | 0 | 0 | 0 | 0 | 0 | Active | 0 | 0 |
| Cycle 17 | 0 | 0 | 0 | 0 | 0 | 0 | 0 | Active | 0 | 0 | 0 |
| Cycle 18 | | | | | | | | | | | |

| | Net f3__out | Net f4__out | Net f5__out | Net out1 |
|---|---|---|---|---|
| Cycle 1 | X | X | X | X |
| Cycle 2 | 0 | X | X | 0 |
| Cycle 3 | (d_sym1) + (e_sym1) | 1 | X | (~a_sym1)(b_sym1) |
| Cycle 4 | (d_sym2) + (e_sym2) | (~b_sym1) + (~c_sym1) + (~d_sym1) | (d_sym1) + (e_sym1) | (~a_sym2)(b_sym2) |
| Cycle 5 | (d_sym3) + (e_sym3) | (~b_sym2) + (~c_sym2) + (~d_sym2) | ((~b_sym1) + (~c_sym1) + (~d_sym1))((d_sym2) + (e_sym2)) + (b_sym1)(c_sym1)(d_sym1)(~d_sym2)(~e_sym2) | (~a_sym3)(b_sym3) |
| Cycle 6 | (d_sym3) + (e_sym3) | (~b_sym2) + (~c_sym2) + (~d_sym2) | ((~b_sym1) + (~c_sym1) + (~d_sym1))((d_sym2) + (e_sym2)) + (b_sym1)(c_sym1)(d_sym1)(~d_sym2)(~e_sym2) | (~a_sym3)(b_sym3) |
| Cycle 7 | si_sym3 | (a_sym3) + (~b_sym3) | (~b_sym2) + (~c_sym2) + (~d_sym2) | (~b_sym3) + (~c_sym3) + (~d_sym3) |
| Cycle 8 | si_sym3 | (a_sym3) + (~b_sym3) | (~b_sym2) + (~c_sym2) + (~d_sym2) | (~b_sym3) + (~c_sym3) + (~d_sym3) |
| Cycle 9 | 0 | (b_sym3)(c_sym3)(d_sym3) | (a_sym3) + (~b_sym3) | (~d_sym2)(~e_sym2) |
| Cycle 10 | 0 | (b_sym3)(c_sym3)(d_sym3) | (a_sym3) + (~b_sym3) | (~d_sym2)(~e_sym2) |
| Cycle 11 | 0 | (d_sym3) + (e_sym3) | (b_sym3)(c_sym3)(d_sym3) | (~si_sym3) |
| Cycle 12 | 0 | (d_sym3) + (e_sym3) | (b_sym3)(c_sym3)(d_sym3) | (~si_sym3) |
| Cycle 13 | 0 | si_sym3 | (d_sym3) + (e_sym3) | 1 |
| Cycle 14 | 0 | si_sym3 | (d_sym3) + (e_sym3) | 1 |
| Cycle 15 | 0 | 0 | si_sym3 | 1 |

TABLE A-continued

| | | | | |
|---|---|---|---|---|
| Cycle 16 | 0 | 0 | si_sym3 | 1 |
| Cycle 17 | 0 | 0 | 0 | 1 |
| Cycle 18 | | | | |

| | Net out2 | Net out3 | Net scan-out |
|---|---|---|---|
| Cycle 1 | X | X | X |
| Cycle 2 | X | X | X |
| Cycle 3 | 0 | X | X |
| Cycle 4 | (b_sym1)(c_sym1)(d_sym1) | (d_sym1) + (e_sym1) | X |
| Cycle 5 | (b_sym2)(c_sym2)(d_sym2) | ((~b_sym1) + (~c_sym1) + (~d_sym1))((d_sym2) + (e_sym2)) + (b_sym1)(c_sym1)(d_sym1)(~d_sym2)(~e_sym2) | X |
| Cycle 6 | (b_sym2)(c_sym2)(d_sym2) | ((~b_sym1) + (~c_sym1) + (~d_sym1))((d_sym2) + (e_sym2)) + (b_sym1)(c_sym1)(d_sym1)(~d_sym2)(~e_sym2) | ((~b_sym1) + (~c_sym1) + (~d_sym1))((d_sym2) + (e_sym2) + (b_sym1)(c_sym1)(d_sym1)(~d_sym2)(~e_sym2) |
| Cycle 7 | (~a_sym3)(b_sym3) | (~b_sym2) + (~c_sym2) + (~d_sym2) | ((~b_sym1) + (~c_sym1) + (~d_sym1))((d_sym2) + (e_sym2) + (b_sym1)(c_sym1)(d_sym1)(~d_sym2)(~e_sym2) |
| Cycle 8 | (~a_sym3)(b_sym3) | (~b_sym2) + (~c_sym2) + (~d_sym2) | (~b_sym2) + (~c_sym2) + (~d_sym2) |
| Cycle 9 | (~b_sym3) + (~c_sym3) + (~d_sym3) | (a_sym3) + (~b_sym3) | (~b_sym2) + (~c_sym2) + (~d_sym2) |
| Cycle 10 | (~b_sym3) + (~c_sym3) + (~d_sym3) | (a_sym3) + (~b_sym3) | (a_sym3) + (~b_sym3) |
| Cycle 11 | (~d_sym2)(~e_sym2) | (b_sym3)(c_sym3)(d_sym3) | (a_sym3) + (~b_sym3) |
| Cycle 12 | (~d_sym2)(~c_sym2) | (b_sym3)(c_sym3)(d_sym3) | (b_sym3)(c_sym3)(d_sym3) |
| Cycle 13 | (~si_sym3) | (d_sym3) + (e_sym3) | (b_sym3)(c_sym3)(d_sym3) |
| Cycle 14 | (~si_sym3) | (d_sym3) + (e_sym3) | (d_sym3) + (e_sym3) |
| Cycle 15 | 1 | si_sym3 | (d_sym3) + (e_sym3) |
| Cycle 16 | 1 | si_sym3 | si_sym3 |
| Cycle 17 | 1 | 0 | si_sym3 |
| Cycle 18 | | | |

For purposes of explaining the present invention, it will be useful to consider the simulation results depicted in Table A as representing a first representation (e.g., RTL) of the scan chain circuit under test. In accordance with the present invention, these results may be compared to a different representation (e.g., schematic) of the scan chain circuit under test for purposes of verifying equivalency. This can be illustrated by assuming that the second representation includes a first bug or error whereby the three inverters 510, 512, 514 around the scannable state-element F4 are missing. This error represents the case of an incorrect logical location of the scannable state-elements. If a symbolic simulator is used to simulate the scan chain design that includes this first error, this would result in the values on the various nets set forth below at Table B:

TABLE B

| | Net a | Net b | Net c | Net d | Net e | Net scan-in | Net clk | Net siclk | Net soclk | Net f1_out | Net f2_out |
|---|---|---|---|---|---|---|---|---|---|---|---|
| Cycle 1 | 0 | 0 | 0 | 0 | 0 | 0 | Active | 0 | 0 | X | X |
| Cycle 2 | a_sym1 | b_sym1 | c_sym1 | d_sym1 | e_sym1 | si_sym1 | Active | 0 | 0 | 1 | 0 |
| Cycle 3 | a_sym2 | b_sym2 | c_sym2 | d_sym2 | e_sym2 | si_sym2 | Active | 0 | 0 | (a_sym1) + (~b_sym1) | (b_sym1)(c_sym1)(d_sym1) |
| Cycle 4 | a_sym3 | b_sym3 | c_sym3 | d_sym3 | e_sym3 | si_sym3 | Active | 0 | 0 | (a_sym2) + (~b_sym2) | (b_sym2)(c_sym2)(d_sym2) |
| Cycle 5 | a_sym3 | b_sym3 | c_sym3 | d_sym3 | e_sym3 | si_sym3 | Active | 0 | 0 | (a_sym3) + (~b_sym3) | (b_sym3)(c_sym3)(d_sym3) |
| Cycle 6 | 0 | 0 | 0 | 0 | 0 | si_sym3 | 0 | 0 | Active | (a_sym3) + (~b_sym3) | (b_sym3)(c_sym3)(d_sym3) |
| Cycle 7 | 0 | 0 | 0 | 0 | 0 | si_sym3 | 0 | Active | 0 | (b_sym3)(c_sym3)(d_sym3) | (d_sym3) + (e_sym3) |
| Cycle 8 | 0 | 0 | 0 | 0 | 0 | 0 | 0 | 0 | Active | (b_sym3)(c_sym3)(d_sym3) | (d_sym3) + (e_sym3) |
| Cycle 9 | 0 | 0 | 0 | 0 | 0 | 0 | 0 | 0 | Active | (d_sym3) + (e_sym3) | si_sym3 |
| Cycle 10 | 0 | 0 | 0 | 0 | 0 | 0 | 0 | 0 | Active | (d_sym3) + (e_sym3) | si_sym3 |
| Cycle 11 | 0 | 0 | 0 | 0 | 0 | 0 | 0 | Active | 0 | si_sym3 | 0 |
| Cycle 12 | 0 | 0 | 0 | 0 | 0 | 0 | 0 | 0 | Active | si_sym3 | 0 |
| Cycle 13 | 0 | 0 | 0 | 0 | 0 | 0 | Active | 0 | 0 | 0 | 0 |

TABLE B-continued

| | | | | | | | | | | | |
|---|---|---|---|---|---|---|---|---|---|---|---|
| Cycle 14 | 0 | 0 | 0 | 0 | 0 | 0 | 0 | 0 | Active | 0 | 0 |
| Cycle 15 | 0 | 0 | 0 | 0 | 0 | 0 | 0 | Active | 0 | 0 | 0 |
| Cycle 16 | 0 | 0 | 0 | 0 | 0 | 0 | 0 | 0 | Active | 0 | 0 |
| Cycle 17 | 0 | 0 | 0 | 0 | 0 | 0 | 0 | Active | 0 | 0 | 0 |
| Cycle 18 | | | | | | | | | | | |

| | Net f3_out | Net f4_out | Net f5_out | Net out1 |
|---|---|---|---|---|
| Cycle 1 | X | X | X | X |
| Cycle 2 | 0 | X | X | 0 |
| Cycle 3 | (d_sym1) + (e_sym1) | 1 | X | (~a_sym1)(b_sym1) |
| Cycle 4 | (d_sym2) + (e_sym2) | (b_sym1) + (c_sym1) + (d_sym1) | (d_sym1) + (e_sym1) | (~a_sym2)(b_sym2) |
| Cycle 5 | (d_sym3) + (e_sym3) | (b_sym2) + (c_sym2) + (d_sym2) | ((~b_sym1) + (~c_sym1) + (~d_sym1))((d_sym2) + (e_sym2)) + (b_sym1)(c_sym1)(d_sym1)(~d_sym2)(~e_sym2) | (~a_sym3)(b_sym3) |
| Cycle 6 | (d_sym3) + (e_sym3) | (b_sym2) + (c_sym2) + (d_sym2) | ((~b_sym1) + (~c_sym1) + (~d_sym1))((d_sym2) + (e_sym2)) + (b_sym1)(c_sym1)(d_sym1)(~d_sym2)(~e_sym2) | (~a_sym3)(b_sym3) |
| Cycle 7 | si_sym3 | (a_sym3) + (~b_sym3) | (b_sym2) + (c_sym2) + (d_sym2) | (~b_sym3) + (~c_sym3) + (~d_sym3) |
| Cycle 8 | si_sym3 | (a_sym3) + (~b_sym3) | (b_sym2) + (c_sym2) + (d_sym2) | (~b_sym3) + (~c_sym3) + (~d_sym3) |
| Cycle 9 | 0 | (b_sym3)(c_sym3)(d_sym3) | (a_sym3) + (b_sym3) | (~d_sym2)(~e_sym2) |
| Cycle 10 | 0 | (b_sym3)(c_sym3)(d_sym3) | (a_sym3) + (b_sym3) | (~d_sym2)(~e_sym2) |
| Cycle 11 | 0 | (d_sym3) + (e_sym3) | (b_sym3)(c_sym3)(d_sym3) | (~si_sym3) |
| Cycle 12 | 0 | (d_sym3) + (e_sym3) | (b_sym3)(c_sym3)(d_sym3) | (~si_sym3) |
| Cycle 13 | 0 | si_sym3 | (d_sym3) + (e_sym3) | 1 |
| Cycle 14 | 0 | si_sym3 | (d_sym3) + (e_sym3) | 1 |
| Cycle 15 | 0 | 0 | si_sym3 | 1 |
| Cycle 16 | 0 | 0 | si_sym3 | 1 |
| Cycle 17 | 0 | 0 | 0 | 1 |
| Cycle 18 | | | | |

| | Net out2 | Net out3 | Net scan-out |
|---|---|---|---|
| Cycle 1 | X | X | X |
| Cycle 2 | X | X | X |
| Cycle 3 | 0 | X | X |
| Cycle 4 | (b_sym1)(c_sym1)(d_sym1) | (d_sym1) + (e_sym1) | X |
| Cycle 5 | (b_sym2)(c_sym2)(d_sym2) | ((~b_sym1) + (~c_sym1) + (~d_sym1))((d_sym2) + (e_sym2)) + (b_sym1)(c_sym1)(d_sym1)(~d_sym2)(~e_sym2) | X |
| Cycle 6 | (b_sym2)(c_sym2)(d_sym2) | ((~b_sym1) + (~c_sym1) + (~d_sym1))((d_sym2) + (e_sym2)) + (b_sym1)(c_sym1)(d_sym1)(~d_sym2)(~e_sym2) | ((~b_sym1) + (~c_sym1) + (~d_sym1))((d_sym2) + (e_sym2)) + (b_sym1)(c_sym1)(d_sym1)(~d_sym2)(~e_sym2) |
| Cycle 7 | (a_sym3)(~b_sym3) | (b_sym2) + (c_sym2) + (d_sym2) | ((~b_sym1) + (~c_sym1) + (~d_sym1))((d_sym2) + (e_sym2)) + (b_sym1)(c_sym1)(d_sym1)(~d_sym2)(~e_sym2) |
| Cycle 8 | (a_sym3)(~b_sym3) | (b_sym2) + (c_sym2) + (d_sym2) | (b_sym2) + (c_sym2) + (d_sym2) |
| Cycle 9 | (b_sym3) + (c_sym3) + (d_sym3) | (a_sym3) + (~b_sym3) | (b_sym2) + (c_sym2) + (d_sym2) |
| Cycle 10 | (b_sym3) + (c_sym3) + (d_sym3) | (a_sym3) + (~b_sym3) | (a_sym3) + (~b_sym3) |
| Cycle 11 | (d_sym2)(e_sym2) | (b_sym3)(c_sym3)(d_sym3) | (a_sym3) + (~b_sym3) |
| Cycle 12 | (d_sym2)(e_sym2) | (b_sym3)(c_sym3)(d_sym3) | (b_sym3)(c_sym3)(d_sym3) |
| Cycle 13 | (si_sym3) | (d_sym3) + (e_sym3) | (b_sym3)(c_sym3)(d_sym3) |
| Cycle 14 | (si_sym3) | (d_sym3) + (e_sym3) | (d_sym3) + (e_sym3) |
| Cycle 15 | 1 | si_sym3 | (d_sym3) + (e_sym3) |
| Cycle 16 | 1 | si_sym3 | si_sym3 |
| Cycle 17 | 1 | 0 | si_sym3 |
| Cycle 18 | | | |

As will be appreciated, other types of discrepancies or errors can occur in a representation. For example, if a third representation indicates an incorrect scan chain order of F3–F2–F1–F5–F4 (instead of F3–F2–F1–F4–F5), a symbolic simulation of the third representation would result in the net values set forth below at Table C:

TABLE C

| | Net a | Net b | Net c | Net d | Net e | Net scan-in | Net clk | Net siclk | Net soclk | Net f1_out | Net f2_out |
|---|---|---|---|---|---|---|---|---|---|---|---|
| Cycle 1 | 0 | 0 | 0 | 0 | 0 | 0 | Active | 0 | 0 | X | X |
| Cycle 2 | a_sym1 | b_sym1 | c_sym1 | d_sym1 | e_sym1 | si_sym1 | Active | 0 | 0 | 1 | 0 |
| Cycle 3 | a_sym2 | b_sym2 | c_sym2 | d_sym2 | e_sym2 | si_sym2 | Active | 0 | 0 | (a_sym1) + (~b_sym1) | (b_sym1)(c_sym1)(d_sym1) |
| Cycle 4 | a_sym3 | b_sym3 | c_sym3 | d_sym3 | e_sym3 | si_sym3 | Active | 0 | 0 | (a_sym2) + (~b_sym2) | (b_sym2)(c_sym2)(d_sym2) |
| Cycle 5 | a_sym3 | b_sym3 | c_sym3 | d_sym3 | e_sym3 | si_sym3 | Active | 0 | 0 | (a_sym3) + (~b_sym3) | (b_sym3)(c_sym3)(d_sym3) |
| Cycle 6 | 0 | 0 | 0 | 0 | 0 | si_sym3 | 0 | 0 | Active | (a_sym3) + (~b_sym3) | (b_sym3)(c_sym3)(d_sym3) |
| Cycle 7 | 0 | 0 | 0 | 0 | 0 | si_sym3 | 0 | Active | 0 | (b_sym3)(c_sym3)(d_sym3) | (d_sym3) + (e_sym3) |
| Cycle 8 | 0 | 0 | 0 | 0 | 0 | 0 | 0 | 0 | Active | (b_sym3)(c_sym3)(d_sym3) | (d_sym3) + (e_sym3) |
| Cycle 9 | 0 | 0 | 0 | 0 | 0 | 0 | 0 | Active | 0 | (d_sym3) + (e_sym3) | si_sym3 |
| Cycle 10 | 0 | 0 | 0 | 0 | 0 | 0 | 0 | 0 | Active | (d_sym3) + (e_sym3) | si_sym3 |
| Cycle 11 | 0 | 0 | 0 | 0 | 0 | 0 | 0 | Active | 0 | si_sym3 | 0 |
| Cycle 12 | 0 | 0 | 0 | 0 | 0 | 0 | 0 | 0 | Active | si_sym3 | 0 |
| Cycle 13 | 0 | 0 | 0 | 0 | 0 | 0 | 0 | Active | 0 | 0 | 0 |
| Cycle 14 | 0 | 0 | 0 | 0 | 0 | 0 | 0 | 0 | Active | 0 | 0 |
| Cycle 15 | 0 | 0 | 0 | 0 | 0 | 0 | 0 | Active | 0 | 0 | 0 |
| Cycle 16 | 0 | 0 | 0 | 0 | 0 | 0 | 0 | 0 | Active | 0 | 0 |
| Cycle 17 | 0 | 0 | 0 | 0 | 0 | 0 | 0 | Active | 0 | 0 | 0 |
| Cycle 18 | | | | | | | | | | | |

| | Net f3_out | Net f4_out | Net f5_out | Net out1 |
|---|---|---|---|---|
| Cycle 1 | X | X | X | X |
| Cycle 2 | 0 | X | X | 0 |
| Cycle 3 | (d_sym1) + (e_sym1) | 1 | X | (~a_sym1)(b_sym1) |
| Cycle 4 | (d_sym2) + (e_sym2) | (~b_sym1) + (~c_sym1) + (~d_sym1) | (d_sym1) + (e_sym1) | (~a_sym2)(b_sym2) |
| Cycle 5 | (d_sym3) + (e_sym3) | (~b_sym2) + (~c_sym2) + (~d_sym2) | ((~b_sym1) + (~c_sym1) + (~d_sym1))((d_sym2) + (e_sym2)) + (b_sym1)(c_sym1)(d_sym1)(~d_sym2)(~e_sym2) | (~a_sym3)(b_sym3) |
| Cycle 6 | (d_sym3) + (e_sym3) | (~b_sym2) + (~c_sym2) + (~d_sym2) | ((~b_sym1) + (~c_sym1) + (~d_sym1))((d_sym2) + (e_sym2)) + (b_sym1)(c_sym1)(d_sym1)(~d_sym2)(~e_sym2) | (~a_sym3)(b_sym3) |
| Cycle 7 | si_sym3 | ((~b_sym1) + (~c_sym1 + (~d_sym1)((d_sym2) + (e_sym2)) + (b_sym2)(c_sym1)(d_sym1)(~d_sym2)(~e_sym2) | (a_sym3) + (~b_sym3) (~d_sym2) | (~b_sym3) + (~c_sym3) + (~d_sym3) |
| Cycle 8 | si_sym3 | ((~b_sym1) + (~c_sym1 + (~d_sym1)((d_sym2) + (e_sym2)) + (b_sym2)(c_sym1)(d_sym1)(~d_sym2)(~e_sym2) | (a_sym3) + (~b_sym3) (~d_sym2) | (~b_sym3) + (~c_sym3) + (~d_sym3) |
| Cycle 9 | 0 | (a_sym3)(~b_sym3) | (b_sym3)(c_sym3)(d_sym3) | (~d_sym2)(~e_sym2) |
| Cycle 10 | 0 | (a_sym3)(~b_sym3) | (b_sym3)(c_sym3)(d_sym3) | (~d_sym2)(~e_sym2) |
| Cycle 11 | 0 | (b_sym3)(c_sym3)(d_sym3) | (d_sym3) + (e_sym3) | (~si_sym3) |
| Cycle 12 | 0 | (b_sym3)(c_sym3)(d_sym3) | (d_sym3) + (e_sym3) | (~si_sym3) |
| Cycle 13 | 0 | (d_sym3) + (e_sym3) | si_sym3 | 1 |
| Cycle 14 | 0 | (d_sym3) + (e_sym3) | si_sym3 | 1 |
| Cycle 15 | 0 | si_sym3 | 0 | 1 |
| Cycle 16 | 0 | si_sym3 | 0 | 1 |
| Cycle 17 | 0 | 0 | 0 | 1 |
| Cycle 18 | | | | |

| Net out2 | Net out3 | Net scan-out |
|---|---|---|

TABLE C-continued

| | | | |
|---|---|---|---|
| Cycle 1 | X | X | X |
| Cycle 2 | X | X | X |
| Cycle 3 | 0 | X | X |
| Cycle 4 | (b_sym1)(c_sym1)(d_sym1) | (d_sym1) + (e_sym1) | X |
| Cycle 5 | (b_sym2)(c_sym2)(d_sym2) | ((~b_sym1) + (~c_sym1) + (~d_sym1))((d_sym2) + (e_sym2)) + (b_sym1)(c_sym1)(d_sym1)(~d_sym2)(~e_sym2) | X |
| Cycle 6 | (b_sym2)(c_sym2)(d_sym2) | ((~b_sym1) + (~c_sym1) + (~d_sym1))((d_sym2) + (e_sym2)) + (b_sym1)(c_sym1)(d_sym1)(~d_sym2)(~e_sym2) | ((~b_sym2) + (~c_sym2) + (~d_sym2)) |
| Cycle 7 | ((~b_sym1) + (~c_sym1) + (~d_sym1))((d_sym2) + (~e_sym2)) + (b_sym1)(c_sym1)(d_sym1)(d_sym2)(e_sym2) | (a_sym3) + (~b_sym3) | (~b_sym2) + (~c_sym2) + (~d_sym2) |
| Cycle 8 | ((~b_sym1) + (~c_sym1) + (~d_sym1))((~d_sym2) + (~e_sym2)) + (b_sym1)(c_sym1)(d_sym1)(d_sym2)(e_sym2) | (a_sym3) + (~b_sym3) | ((~b_sym1) + (~c_sym1) + (~d_sym1))((d_sym2) + (e_sym2)) + (b_sym1)(c_sym1)(d_sym1)(~d_sym2)(~e_sym2) |
| Cycle 9 | (~a_sym3)(b_sym3) | (b_sym3)(c_sym3)(d_sym3) | ((~b_sym1) + (~c_sym1) + (~d_sym1))((d_sym2) + (e_sym2)) + (b_sym1)(c_sym1)(d_sym1)(~d_sym2)(~e_sym2) |
| Cycle 10 | (~a_sym3)(b_sym3) | (b_sym3)(c_sym3)(d_sym3) | (a_sym3) + (~b_sym3) |
| Cycle 11 | (~b_sym3)(~c_sym3) + (~d_sym3) | (d_sym3) + (e_sym3) | (a_sym3) + (~b_sym3) |
| Cycle 12 | (~b_sym3)(~c_sym3) + (~d_sym3) | (d_sym3) + (e_sym3) | (b_sym3)(c_sym3)(d_sym3) |
| Cycle 13 | (~d_sym2)(~e_sym2) | (si_sym3) | (b_sym3)(c_sym3)(d_sym3) |
| Cycle 14 | (~d_sym2)(~e_sym2) | (si_sym3) | (d_sym3) + (e_sym3) |
| Cycle 15 | (~si_sym3) | 0 | (d_sym3) + (e_sym3) |
| Cycle 16 | (~si_sym3) | 0 | si_sym3 |
| Cycle 17 | 1 | 0 | si_sym3 |
| Cycle 18 | | | |

When the methodology of the present invention is used to symbolically simulate different representations of the scan chain design depicted in FIG. 5, the equivalency of different representations of the scan chain design is evaluated by comparing the output nodes (out1, out2, out3, etc.) and/or the scan-out pin during each cycle of simulation. For example, a comparison of the output nodes for the first representation (see Table A) and the second representation (see Table B) during each cycle reveals that there are differences (e.g., during cycles 7–17 at output node out2 and cycles 7–8 at output node out3). In accordance with the present invention, these differences may be used to identify discrepancies between the representations.

As will also be appreciated, the methodology of the present invention is generally applicable to any design without feedback loops, not just custom circuits. However, the present invention may also be extended to designs with feedback loops by adjusting the SS_LATENCY number appropriately. In designs with feedback loops, the SS_LATENCY value is the number of functional mode cycles required, with symbols applied to primary inputs, so that each signal in the logic cone feeding each scannable state-element is symbolic. In general, the SS_LATENCY value for designs with feedback loops is high. With either type of design (feedback or no feedback), if the SS_LATENCY number is too high, the symbolic simulator may run into capacity issues.

In accordance with the present invention, the user-specified, design-specific parameters SS_LATENCY and SC_LENGTH should accurately specify the minimum threshold values for the circuit designs under comparison. For each design, these parameters have a certain minimum required value as described herein. However, choosing arbitrarily large values for the SS_LATENCY parameter could increase the complexity of the symbolic expressions exponentially and overflow symbolic simulation tool capacity limits. While there is no way to check the accuracy of the SS_LATENCY parameter, the SC_LENGTH parameter can be cross-verified by confirming that the symbol applied to a scan-in pin arrives at the scan-out pin after (SC_LENGTH+1) scan shifts.

In accordance with a selected embodiment of the present invention, symbolic simulation is used to verify scan chain equivalency by loading each scannable state-element in the design with a symbolic expression that is characteristic of the logical location of that element. A scan shift operation is then performed to verify the contents of each scannable state-element at the scan-out and other primary output pins of the design. These two steps verify the equivalency of the scan chain with respect all its characteristics. With this approach, the circuit design may be exhaustively checked under all legal input combinations. In addition, there is no need for any post simulation analysis to evaluate the quality of the patterns used. The present invention may also be used to ensure one-to-one equivalency of the logic cone(s) in front of each and every scannable state-element under every legal condition, which enables seamless ATPG vector playback between the two models as long as the vectors are limited to legal combinations. This is very beneficial as it drastically simplifies the ATPG vector analysis and debug procedures. With the present invention, a minimal amount of design-specific information is required as input to the procedure, and even that information can be easily determined automatically using a simple HDL front-end compiler. As a result, the time required to perform scan chain equivalency is reduced significantly, with typical run times ranging from a few minutes to few hours. As will be appreciated, the scan-chain verification procedure described herein enables seamless ATPG playback between RTL and schematic descriptions of a circuit as the logical location of each scannable state-element is verified to be equal between them.

As will be appreciated, the present invention may be implemented in a computer accessible medium including one or more data structures representative of the circuitry and operations included in the system described herein. Generally speaking, a computer accessible medium may include storage media such as magnetic or optical media, e.g., disk, CD-ROM, or DVD-ROM, volatile or non-volatile memory media such as RAM (e.g., SDRAM, RDRAM, SRAM, etc.), ROM, etc., as well as media accessible via transmission media or signals such as electrical, electromagnetic, or digital signals, conveyed via a communication medium such as a network and/or a wireless link. For example, data structure(s) of the circuitry on the computer accessible medium may be read by a program and used, directly or indirectly, to implement the hardware comprising the circuitry described herein. For example, the data structure(s) may include one or more behavioral-level descriptions or register-transfer level (RTL) descriptions of the hardware functionality in a high level design language (HDL) such as Verilog or VHDL. The description(s) may be read by a synthesis tool which may synthesize the description to produce one or more netlist(s) comprising lists of gates from a synthesis library. The netlist(s) comprise a set of gates which also represent the functionality of the hardware comprising the circuitry. The netlist(s) may then be placed and routed to produce one or more data set(s) describing geometric shapes to be applied to masks. The masks may then be used in various semiconductor fabrication steps to produce a semiconductor circuit or circuits corresponding to the circuitry. Alternatively, the data structure(s) on computer accessible medium may be the netlist(s) (with or without the synthesis library) or the data set(s), as desired. In yet another alternative, the data structures may comprise the output of a schematic program, or netlist(s) or data set(s) derived therefrom. While a computer accessible medium may include a representation of the present invention, other embodiments may include a representation of any portion of the symbol-based scan chain verification techniques described and disclosed herein.

While the system and method of the present invention has been described in connection with the preferred embodiment, it is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

What is claimed is:

1. A method for verifying scan chain equivalency between two representations of a circuit design having at least one scannable state element, at least one scan-out pin and at least one output pin, comprising:

for each representation of the circuit design, loading each scannable state element with a symbolic expression that characterizes a logical location of said scannable element in the circuit design; and for each representation of the circuit design, performing a scan shift operation to verify a content value for each scannable state element at said scan-out pin and said output pin of the design.

2. The method of claim 1, wherein the two representations of a circuit design comprise a switch-level netlist and an RTL netlist.

3. The method of claim 1, wherein the two representations of a circuit design comprise a transistor level implementation and a behavioral level description.

4. The method of claim 1, wherein the two representations of a circuit design comprise RTL and schematic models of a memory circuit.

5. The method of claim 1, wherein the two representations of a circuit design comprise a first RTL model of a storage circuit and a second RTL model of a storage circuit.

6. The method of claim 1, wherein the two representations of a circuit design comprise a SPICE-level netlist and a gate level description.

7. The method of claim 1, wherein said loading of each scannable state element with a symbolic expression comprises simulating said circuit design in a functional mode for a first minimum threshold number of cycles by applying symbolic expressions to at least a first input for said circuit design.

8. The method of claim 7, wherein said first minimum threshold number comprises a maximum sequential depth of all scannable state-elements on all paths from all primary inputs in said circuit design.

9. The method of claim 1, wherein said loading and performing steps are implemented with a symbolic simulator to check scan chain equivalency with respect to complete scan chain connectivity from primary input to primary output, logical location of all scannable state elements, scan chain length and scan chain order.

10. The method of claim 1, wherein said loading and performing steps are implemented with a symbolic simulator to obtain complete coverage.

11. The method of claim 1, wherein said scan shift operation comprises simulating a sequence of scan clocks equal to a multiple of the number of scannable state-elements in the circuit design.

12. A method for verifying scan chain equivalency between two representations of a circuit design having at least one scannable state element, at least one scan-out pin and at least one output pin, comprising:

for each representation of the circuit design, loading each scannable state element with a symbolic expression that characterizes a logical location of said scannable element in the circuit design;

for each representation of the circuit design, performing a scan shift operation to generate scan-out pin values at said scan-out pin; and comparing scan-out pin values from each representation of the circuit design to verify scan chain equivalency between the two representations of the circuit design.

* * * * *